(12) United States Patent
Bjorkman et al.

(10) Patent No.: US 10,075,310 B2
(45) Date of Patent: Sep. 11, 2018

(54) ADAPTIVE LINEARIZER

(71) Applicant: LOCKHEED MARTIN CORPORATION, Bethesda, MD (US)

(72) Inventors: Marc Ronald Bjorkman, Yardley, PA (US); Novellone Rozario, Yardville, NJ (US); Jason Michael Teixeira, Philadelphia, PA (US); Douglas V. McKinnon, Littleton, CO (US); Kim Thomas Lancaster, New Hope, PA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/836,865

(22) Filed: Aug. 26, 2015

(65) Prior Publication Data

US 2016/0065400 A1    Mar. 3, 2016

Related U.S. Application Data

(60) Provisional application No. 62/043,361, filed on Aug. 28, 2014.

(51) Int. Cl.
*H03F 1/32* (2006.01)
*H04L 27/01* (2006.01)
(Continued)

(52) U.S. Cl.
CPC ........... *H04L 27/01* (2013.01); *H03F 1/0205* (2013.01); *H03F 1/0266* (2013.01); *H03F 1/0272* (2013.01); *H03F 1/30* (2013.01); *H03F 1/3247* (2013.01); *H03F 1/3276* (2013.01); *H03F 3/19* (2013.01); *H03F 3/195* (2013.01); *H03F 3/211* (2013.01); *H03F 3/245* (2013.01); *H04L 25/03343* (2013.01); *H03F 1/3241* (2013.01); *H03F 2200/102* (2013.01); *H03F 2200/105* (2013.01); *H03F 2200/204* (2013.01); *H03F 2200/405* (2013.01); *H03F 2200/447* (2013.01); *H03F 2200/451* (2013.01); *H03F 2200/465* (2013.01); *H03F 2200/468* (2013.01);
(Continued)

(58) Field of Classification Search
CPC ............. H03F 2200/451; H03F 1/3241; H04L 27/367; H04L 27/368
See application file for complete search history.

(56) References Cited

U.S. PATENT DOCUMENTS 5,900,778 A * 5/1999 Stonick ................. H03F 1/3247
                                                    330/149
5,915,213 A * 6/1999 Iwatsuki ............... H03F 1/3247
                                                    375/297
(Continued)

*Primary Examiner* — Jean B Corrielus
(74) *Attorney, Agent, or Firm* — McDermott Will & Emery LLP

(57) ABSTRACT

An adaptive linearizer system includes an adaptive linearizer circuit that is configured to pre-distort an input signal based on one or more control signals to generate a pre-distorted signal, and a non-linear high-power amplifier (HPA) having non-linear characteristics that is coupled to the adaptive linearizer circuit. The nonlinear HPA amplifies the pre-distorted signal. The pre-distortion characteristics of the adaptive linearizer circuit provide for countering the non-linear characteristics of the non-linear HPA and compensating a non-linearity of the non-linear HPA.

20 Claims, 11 Drawing Sheets

(51) Int. Cl.

| | | |
|---|---|---|
| *H03F 1/02* | (2006.01) | |
| *H03F 3/19* | (2006.01) | |
| *H03F 3/21* | (2006.01) | |
| *H04L 25/03* | (2006.01) | |
| *H03F 1/30* | (2006.01) | |
| *H03F 3/195* | (2006.01) | |
| *H03F 3/24* | (2006.01) | |
| *H04L 27/36* | (2006.01) | |

(52) U.S. Cl.
  CPC .. *H03F 2203/21127* (2013.01); *H04L 27/368* (2013.01); *H04L 2025/03401* (2013.01)

(56) References Cited

U.S. PATENT DOCUMENTS

| | | | | |
|---|---|---|---|---|
| 6,320,463 B1* | 11/2001 | Leva | ............... | H03F 1/3247 330/136 |
| 6,775,330 B2* | 8/2004 | Bach | ............... | H04L 25/03343 375/285 |
| 8,587,378 B2* | 11/2013 | Khandavalli | ...... | H03F 1/3241 330/109 |
| 9,668,208 B2* | 5/2017 | Camuffo | ............ | H04B 1/0475 |
| 2002/0080891 A1* | 6/2002 | Ahn | ............ | H03F 1/3247 375/297 |
| 2003/0179831 A1* | 9/2003 | Gupta | ............ | H03F 1/3247 375/296 |
| 2007/0241812 A1* | 10/2007 | Yang | ............ | H03F 1/3247 330/75 |
| 2007/0252646 A1* | 11/2007 | Leung | ............ | H03F 1/0266 330/136 |
| 2008/0174365 A1* | 7/2008 | Yang | ............ | H03F 1/3247 330/149 |
| 2008/0265996 A1* | 10/2008 | Kim | ............ | H03F 1/3247 330/291 |
| 2010/0156539 A1* | 6/2010 | Ha | ............ | H03F 1/0261 330/285 |
| 2011/0065381 A1* | 3/2011 | Hausman | ......... | H04B 7/18513 455/12.1 |
| 2012/0071120 A1* | 3/2012 | Pinarello | ......... | H03F 1/0244 455/127.5 |
| 2013/0005283 A1* | 1/2013 | van Zelm | ......... | H03F 1/3247 455/114.3 |
| 2014/0003553 A1* | 1/2014 | Lozhkin | ......... | H03F 1/3241 375/297 |
| 2014/0354350 A1* | 12/2014 | Bowers | ......... | H03F 3/195 327/564 |
| 2015/0071306 A1* | 3/2015 | Lin | ......... | H04L 47/826 370/468 |
| 2016/0087712 A1* | 3/2016 | Beidas | ......... | H04B 7/18517 375/214 |

\* cited by examiner

ADAPTIVE LINEARIZER

CROSS-REFERENCE TO RELATED APPLICATIONS

This application claims the benefit of priority under 35 U.S.C. § 119 from U.S. Provisional Patent Application 62/043,361 filed Aug. 28, 2014, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to linearizers, and more particularly, to high linearity adaptive linearizer.

BACKGROUND

Performance of communications systems is driven by many factors that relate to either signal fidelity or signal-to-noise ratio (SNR). Fidelity relates to the faithful reproduction of the shape of the signal. SNR relates to the noise and interference levels in the system that transmits the signal. Designers and operators of communications systems that include an element that repeats the signal, such as a satellite transponder, strive to minimize the degradations to fidelity and SNR that occur in the transmission system. One parameter of a communications system, among others, that characterizes degradation is linearity. Linearity is typically most affected by the amplifiers in a communications system, particularly the final amplifier in the systems, also known as the high-power amplifier (HPA). HPAs in satellite systems are typically either solid state power amplifiers (SSPAs) or travelling-wave tube amplifiers (TWTAs).

In linear communications systems, the output signal (y) is linearly proportional to the input signal (x), related by only a multiplier (e.g., an amplification factor, a) and a constant (e.g., a bias, b). A plot of the output signal versus the input signal would produce a straight line (e.g., y=ax+b). Actual and practical communication systems amplifiers are typically linear over a limited range of input signal levels. For example, in the amplitude transfer function graph that has input signal level on the horizontal axis and output signal level on the vertical axis, as the input signal increases past this linear region, the output signal starts to compress (e.g., have reduced amplification) and will typically saturate (e.g., reach a level in which the output no longer increases as the input level increases). Similar linearity issues affect the phase response of an amplifier as well.

While practical amplifiers cannot avoid this non-linear behavior, users and designers of communications systems strive to minimize the extent of the non-linear region of the amplitude and phase transfer functions, attempting to match the performance of a practical ideal amplifier, which is perfectly linear until saturation is reached. In a typical application, a target linearity for a particular type of communications signal is determined, and then the amplifier is backed-off (e.g., input signal is moved lower than saturation) to an operating point that enables amplifier linearity performance to match requirements. A more linear system allows the system to be backed-off less, therefore, enabling higher output power (which benefits SNR), saving critical power resources, or both.

One way to allow an amplifier to more closely match the performance of an ideal practical amplifier is to use a linearizer. A linearizer is typically utilized in the amplification stages prior to the final HPA, with the objective of attempting to pre-distort the signal in such a way that the signal passing through the linearizer and then the HPA more closely matches the performance of an ideal practical amplifier. The linearizer attempts to provide the inverse of the shape of the HPA amplitude and phase, thereby, yielding a more linear amplifier function. Current generation linearizers, generally devised in the 1990s, provide acceptable performance. However, new satellite applications are moving to signal types that require higher (e.g., ultra-high) linearity and higher power to preserve the fidelity of the signal without excessive back-off. These systems may typically employ higher-order modulation types (e.g., 16APSK, 32APSK . . . 256APSK).

SUMMARY

In some aspects, an adaptive linearizer system includes an adaptive linearizer circuit that is configured to pre-distort an input signal based on one or more control signals to generate a pre-distorted signal, and a non-linear high-power amplifier (HPA) having non-linear characteristics that is coupled to the adaptive linearizer circuit to amplify the pre-distorted signal. The pre-distortion characteristics of the adaptive linearizer circuit provide for countering the non-linear characteristics of the non-linear HPA and compensating a non-linearity of the non-linear HPA.

In other aspects, a method of compensating non-linearity of a non-linear high-power amplifier (HPA) includes providing an adaptive linearizer circuit, and configuring the adaptive linearizer circuit to pre-distort an input signal based on one or more control signals and to generate a pre-distorted signal. A non-linear high-power amplifier (HPA) having non-linear characteristics is coupled to the adaptive linearizer circuit. The HPA provides for amplifying the pre-distorted signal. Pre-distortion characteristics of the adaptive linearizer circuit provide for countering the non-linear characteristics of the non-linear HPA and compensating a non-linearity of the non-linear HPA.

In yet other aspects, a satellite communication system includes a satellite transmit antenna configured to transmit signals to a ground receiver antenna. An adaptive linearizer circuit is configured to dynamically pre-distort an input signal based on one or more control signals to generate a pre-distorted signal. A non-linear high-power amplifier (HPA) having non-linear characteristics is coupled to the adaptive linearizer circuit to amplify the pre-distorted signal. Pre-distortion characteristics of the adaptive linearizer circuit provide for countering the non-linear characteristics of the non-linear HPA and compensating a non-linearity of the non-linear HPA.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to methods and configuration for providing a high-linearity adaptive linearizer. The linearizer of the subject technology improves the linearity of the amplifiers that drive the HPA in communications systems to a level significantly beyond the current state of the art. The subject solution enables advanced applications such as (but limited to) ultra-high definition TV (UHDTV), high-throughput satellites (HTS), ultra-high quality contribution services, and more. Current state of the art linearizers are typically fixed bias (non-modifiable performance) over the life of the linearizer in the communication system. The subject technology improves linearization of the power amplifier by using an adaptive linearizer that can dynamically adjust one or more bias parameters of the linearizer.

Figure 1A:
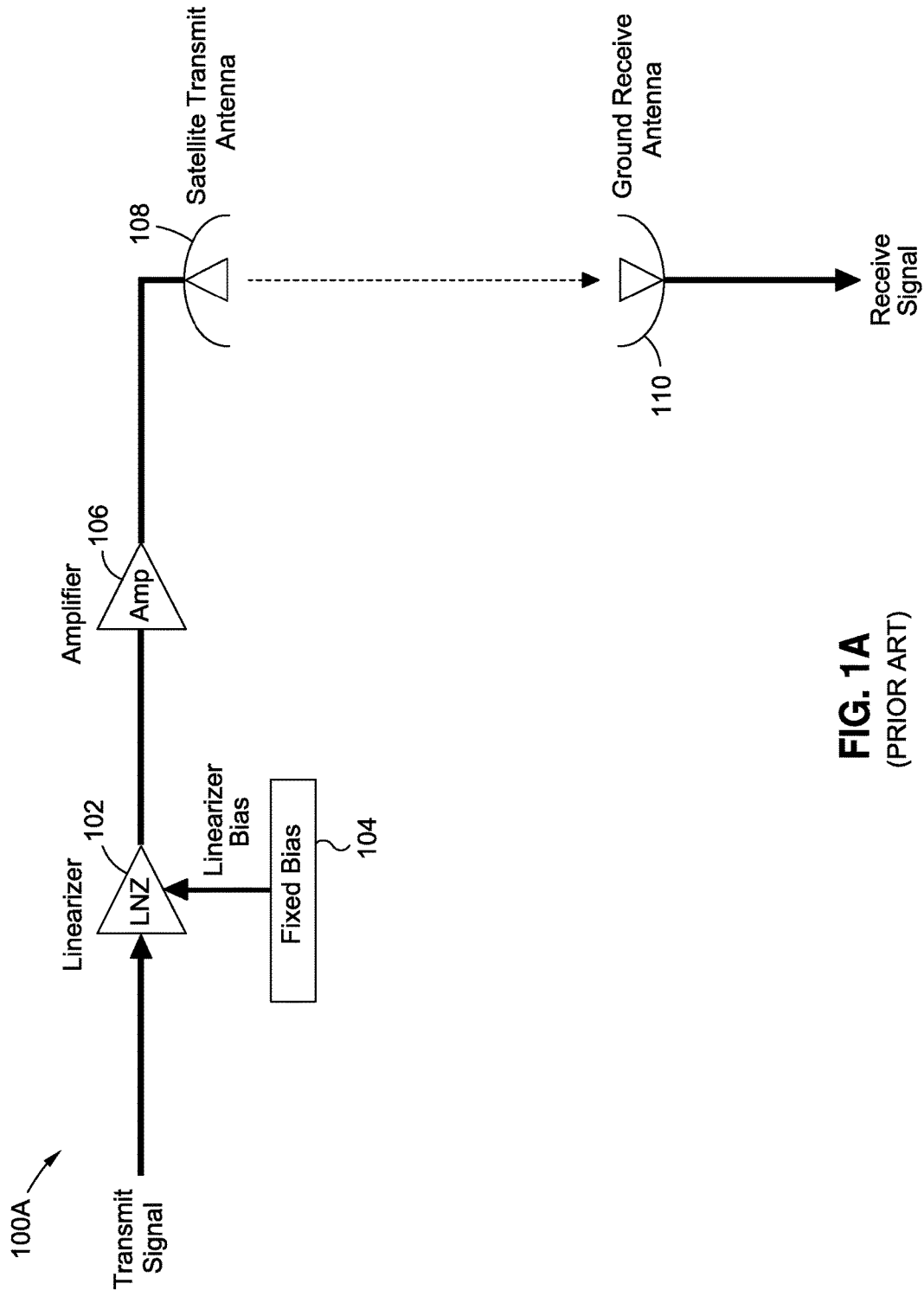
FIG. 1A is a conceptual diagram illustrating an example of a communication system using a single linearizer.
Figure 1B:
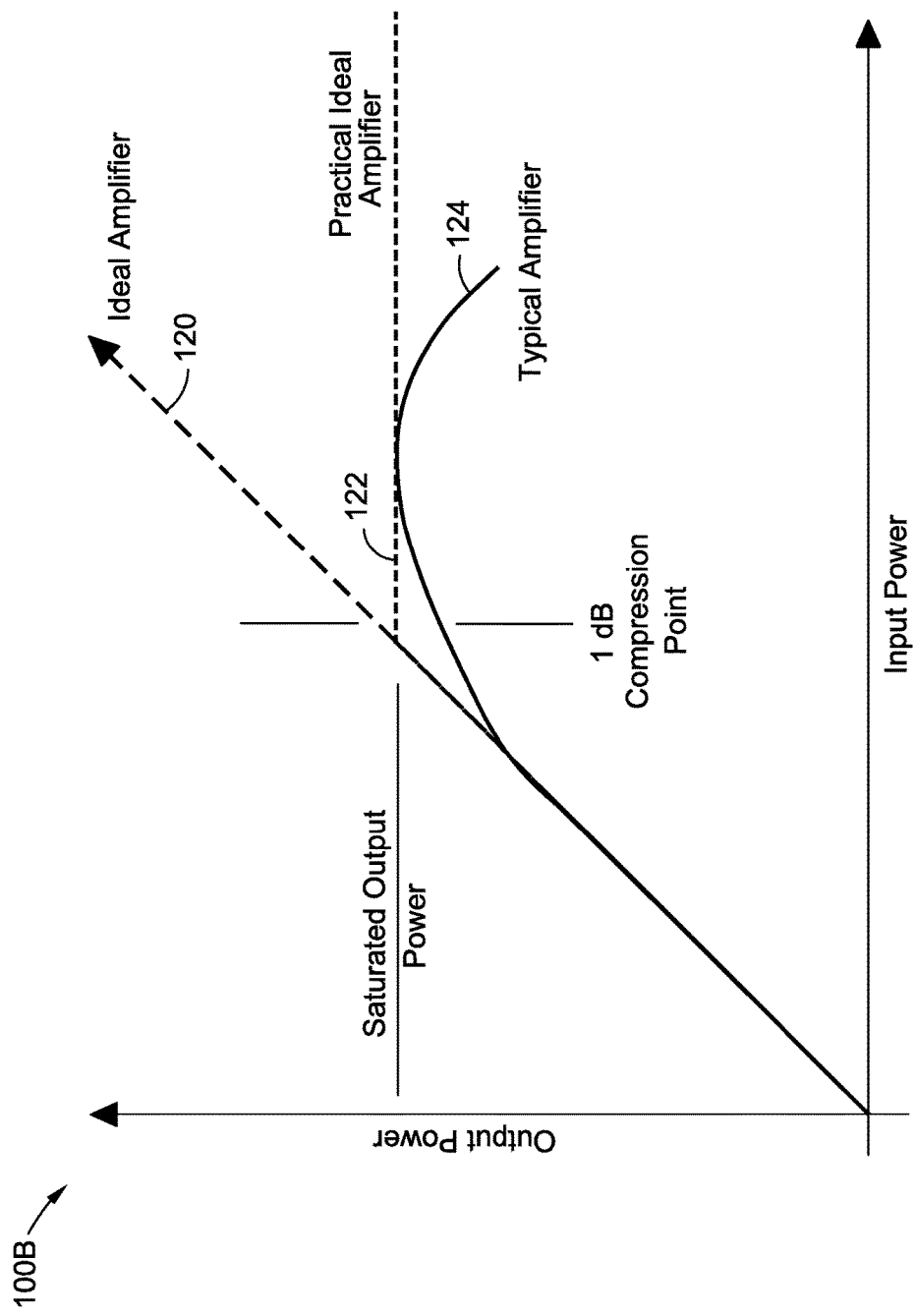
FIG. 1B is a diagram illustrating an example plot of power amplifier transfer functions.

FIG. 1A is a conceptual diagram illustrating an example of a communication system 100A using a single linearizer 102. The communication system 100A includes, but is not limited to, a linearizer 102, a bias circuit 104, a power amplifier 106, a transmit antenna 108 (e.g., a satellite transmit antenna) and a receive antenna 110 (e.g., a ground receive antenna). The input signal (e.g., a transmit signal) to the linearizer 102 is provided by other circuitry including RF driver stages not shown for simplicity. The linearizer 102 pre-distort the transmit signal and provides a pre-distorted signal to the power amplifier 106. The pre-distortion characteristics of the linearizer 102 are desirable if they counter the non-linearity characteristics of the power amplifier such that the non-linearity of the power amplifier is compensated by the pre-distortion characteristics of the linearizer. The bias circuit 104 provides a fixed bias current (or voltage) for the linearizer 102. The fixed bias is designed to enable the linearizer to provide the desired pre-distortion characteristics. However, the ability of a fixed-bias linearizer in compensating the non-linear characteristics of a high-power amplifier is quite limited. The subject technology provides improved pre-distortion characteristics that are capable of compensating the non-linearity of a high-power amplifier and allows using signals with higher-order modulation types (e.g., 16APSK, 32APSK . . . 256APSK). The non-linearity characteristics of power amplifiers and the pre-distortion characteristics of linearizers are explained in more details herein FIG. 1B is a diagram illustrating an example plot 100B of power amplifier transfer functions. The plot 100B includes transfer function 120, 122, and 124 of an ideal power amplifier, a practical power amplifier, and a typical power amplifier, respectively. The transfer function herein is an amplitude transfer function defined as the variation of the output power magnitude versus the input power magnitude (also known an AM-AM response). The transfer function 120 of the ideal power amplifier is a linear function over the entire range of the input power. No practical amplifier has such an ideal characteristics. In a practical amplifier the transfer function 122 saturates at an input power level, after which the output power stays constant. The typical amplifier transfer function 124 is even farther from the ideal transfer function and only follows the ideal behavior up to a certain level of input power and after reaching the saturation level of the practical amplifier transfer function (e.g., 122) may start dropping. The input power level at which the typical amplifier transfer function 124 is deviated from the ideal transfer function 120, by 1-dB of output power, is known as the 1-dB compression point. The objective of the subject technology is to improve linearity of the high-power amplifier (e.g., with higher I-dB compression point) by providing an adaptive linearizer.

Figure 1C:
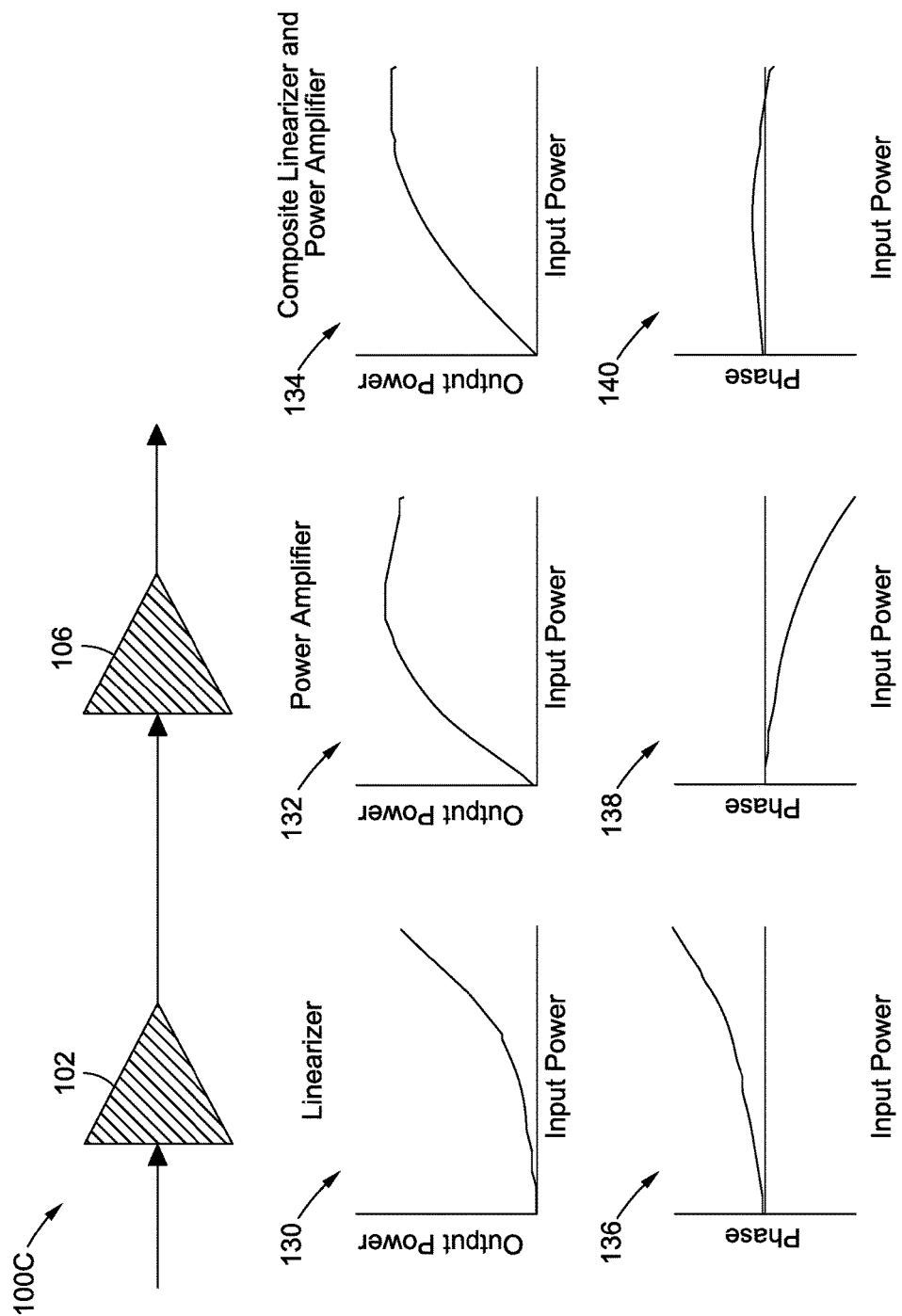
FIG. 1C is a diagram illustrating examples of power amplifier characteristics and linearizer pre-distortion characteristics used in linearization by pre-distortion.

FIG. 1C is a diagram illustrating examples of power amplifier characteristics and linearizer pre-distortion characteristics used in linearization by pre-distortion. A power amplifier 106 is preceded by a linearizer 102 which is used to pre-distort a transmit signal before reaching the power amplifier 106. The non-linearity characteristics of the power amplifier 106 have to be compensated by the countering pre-distortion characteristics of linearizer 102. The non-linearity characteristics of a power amplifier (e.g., 106) includes the amplitude characteristic (e.g., transfer function) 132 (e.g., AM-AM response) and a phase characteristic (e.g., phase response) 138 (also known as AM-PM response) showing variation of a phase of the output power of the power amplifier versus amplitude values of the input power of the power amplifier. The pre-distortion characteristics of the linearizer 102 also include a pre-distortion amplitude characteristic (e.g. transfer function) 130 and a pre-distortion phase characteristic (e.g., phase response) 136.

The composite effect of the linearizer 102 and the power amplifier 106 can be obtained by combining the pre-distortion characteristics 130 and 136 of the linearizer 102 with the non-linearity characteristics 132 and 138 of the power amplifier 106. The combination can be achieved by multiplying the amplitude transfer function 132 by the pre-distortion amplitude characteristic 130, and by adding the phase responses 138 and 136. The resulting amplitude and phase characteristics 134 and 140 are shown to approach characteristics of a practical power amplifier. The phase characteristic of a practical amplifier deviates from zero by a small value at some input power levels and is zero at some other input power levels. In ideal conditions, the pre-distortion amplifier characteristic 130 of the linearizer 102 needs to be an inverse of the transfer function 132 of the power amplifier 106 and a pre-distortion phase response 136 of the linearizer 102 needs to oppose (e.g., have the same amplitude but opposite sign) the phase response 138 of the power amplifier 106. In a practical situation, however, the above ideal conditions can only be achieved in a limited range of the input power and the improvement of the linearization extends that limited range to higher values of input power, as further described herein.

Figure 2A:
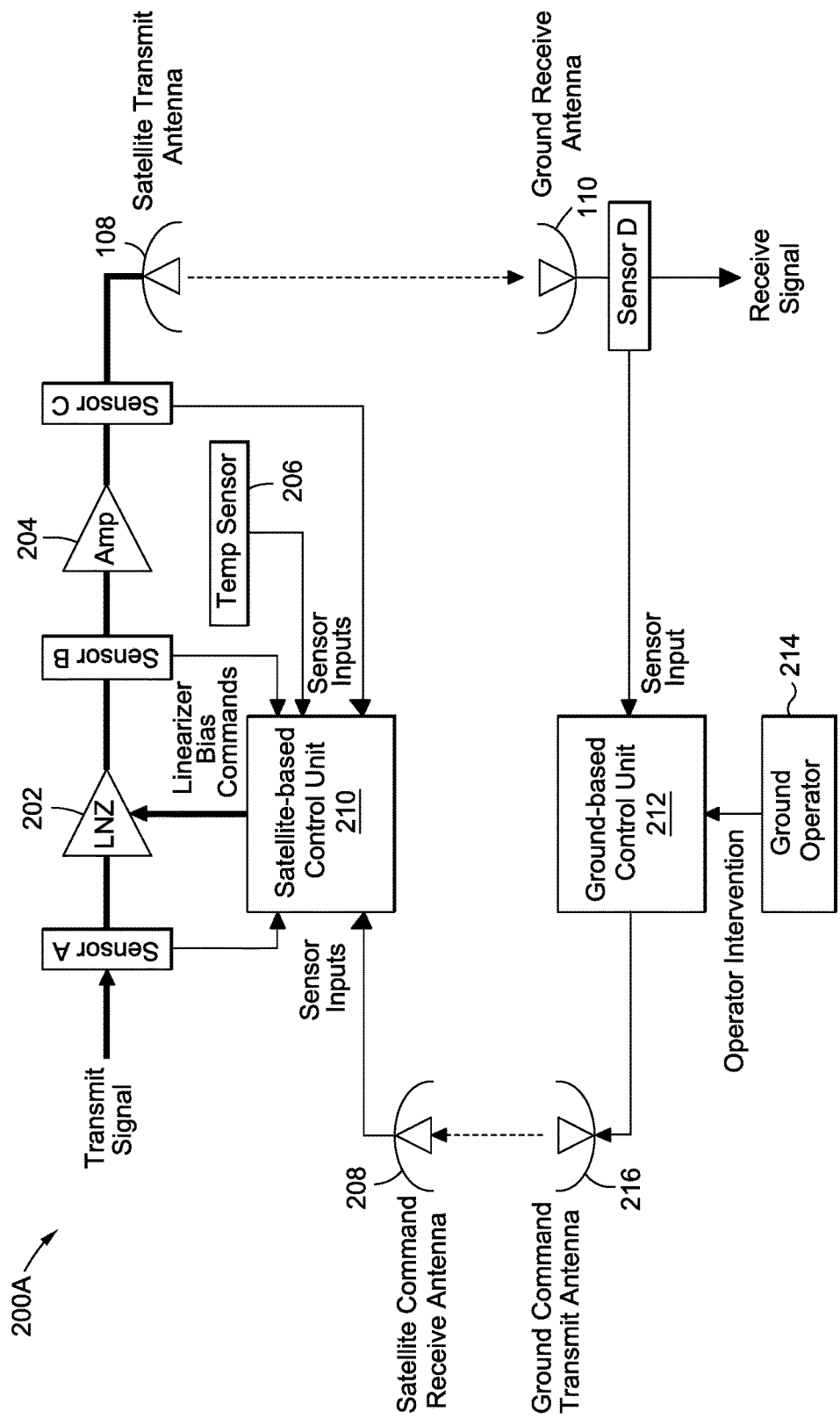
FIG. 2A is a diagram illustrating an example of a communication system using an adaptive linearizer scheme, according to certain aspects.

FIG. 2A is a diagram illustrating an example of a communication system 200A using an adaptive linearizer scheme, according to certain aspects of the subject technology. The communication system 200A is similar to the communication system 100A of FIG. 1A, except for an adaptive linearizer that is replacing the single-stage linearizer circuit 102 of FIG. 1A and a ground-based system including a ground command transmit antenna 216, and a ground-based control unit 212. The adaptive linearizer includes, but is not limited to, a linearizer circuit 202, a satellite-based control unit 210, the ground-based control unit 212, sensors A through D, and a temperature sensor 206. The sensors A, B, and C are positioned in a signal path, on the satellite portion of the communication system 200A, before and after the linearizer 202 and after the power amplifier 204, respectively. The sensor D is positioned in the signal path, on the ground portion of the communication system 200A, after reception of the ground receive antenna 110. Each of the sensors A through D can measure one or more operating conditions such as a peak-power, a peak voltage, an average power, an average voltage, a power back-off, a modulation type, an operating frequency, and/or other operating conditions of the communication system 200A. The adaptive linearizer allows improved linearization of the power amplifier 204 which can be a non-linear high-power amplifier (HPA) (e.g., a travelling wave tube amplifier (TWTA) of a satellite communication system). The temperature sensor 206 may measure a temperature of the power amplifier 204 or a temperature of the system (e.g., the satellite portion the communication system 200A).

The adaptive linearizer, as shown in FIG. 2A, can adapt the performance of the linearizer by operating in an operator-in-loop mode of operation, in an autonomous mode of operation, or a combination of both modes. In the operator-in-loop mode of operation, control signals from the ground-based control unit 212 are transmitted through the ground command transmit antenna 216 to the satellite command receive antenna 208, and are received by the satellite-based control unit 210. The signals transmitted by the ground-based control unit 212 may include commands from a ground operator 214 and signals from the sensor D in the receiver path of the ground receive antenna 110. The ground operator 214 may intervene to enter inputs regarding conditions of the communication system 200A that are known to the ground operator 214, for instance, a signal modulation type (e.g., 32APSK, 64APSK, 128APSK, and 256APSK) or other information.

The sensor data received from some or all of the sensors A through D and the temperature sensor 206 are collected and aggregated by the satellite-based control unit 210 using an adaption algorithm discussed below. The adaptive linearizer allows improved linearization of the power amplifier 204 by dynamically adjusting the pre-distortion characteristics of the linearizer 202. The pre-distortion characteristics of the linearizer 202 can be adjusted by adapting a bias voltage or current of the linearizer 202, for example, by sending linearizer bias commands to the linearizer 202.

Figure 2B:
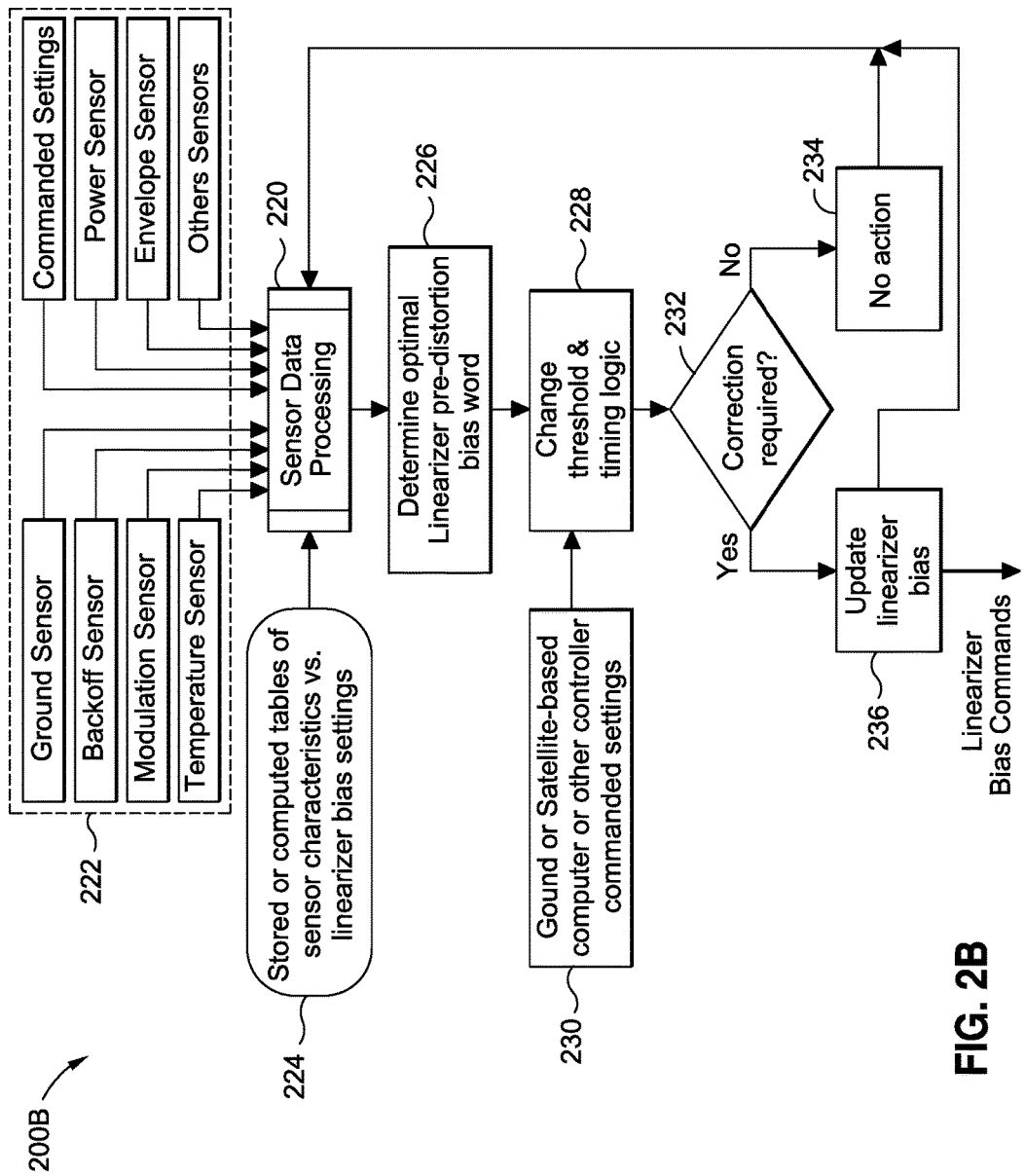
FIG. 2B is a flow diagram illustrating an example of an algorithm for controlling bias settings of an adaptive linearizer, according to certain aspects.

FIG. 2B is a flow diagram illustrating an example of an algorithm 200B for controlling a bias settings of an adaptive linearizer, according to certain aspects of the subject technology. Data from various sensors is fed into the satellite-based control unit 210 for data-processing using the adaptation algorithm 200B. Sensor data 222 may include a number of conditions of the satellite system 200A of FIG. 2A. For example, the sensor data 222 may include one or more operating conditions such as a peak-power, a peak voltage, an average power, an average voltage, a power back-off, a modulation type, an operating frequency, and/or other operating conditions of the communication system 200A. At sensor data processing operation block 220, the sensor data 222 and pre-determined set points 224 are processed and the results are used for the optimization operation block 226. The pre-determined set points 224 can be stored on memory (e.g., an internal memory of the communication system 200A or an external memory such as memory of a computer system linked to the communication system 200A) in the form of, for example, tables of sensor characteristics versus bias settings of the linearizer (e.g., 202 of FIG. 2A). For instance, a table of sensor characteristics may include multiple rows corresponding to bias settings (e.g., current or voltage values) and columns that provide a number of values for various sensor readings that are optimized for those bias values.

The sensor data processing 220 may be handled by a dedicated processor of communication system 200A or an external processor (e.g., of a computer system linked to the communication system 200A). The sensor data processing 220 may include transforming sensor data from their raw form into analyzable engineering format (e.g., numerical representations of temperature in degrees, total input/output signal back-off, modulation type, etc.). At operation block 226, the optimal bias value (e.g., a pre-distortion bias word) that optimizes the pre-distortion characteristics of the linearizer 202 to best counter the non-linearity characteristics of the power amplifier 204 of FIG. 2A is determined. For example, the transformed sensor data is compared to pre-computed tables of sensor characteristics versus linearizer bias settings to determine a match to the current sensor values, which is an optimal linearizer bias setting. Pre-computed tables can be retrieved from the linearizer internal memory or memory of a satellite on-board computer or in satellite ground station equipment.

At an operation block 228, logic circuits or a logic algorithm based in software compares the optimal linearizer bias settings with a current state of the linearizer bias setting to determine if a correction is required. The correction is required if the difference between the optimal linearizer bias setting and the current state of the linearizer bias setting is larger than a predefined threshold. The predefined threshold may be programmed or changeable. Other than the predefined threshold, there is a timing rule that has to be observed before updating linearizer bias setting. The timing rule defines the frequency of and/or conditions for updating the linearizer bias settings. For example, the timing rule may dictate that the linearizer bias setting takes place no more frequently than every one minute or at certain times of day or while certain types/levels of traffic are detected. The predefined threshold and/or timing rules can be accessible from a source 230, which includes commanded and/or settings from a ground or satellite-based computer or other controller(s).

At decision block 232, if the threshold and timing rules as explained above are satisfied, control is transferred to operation block 236, where the linearizer bias settings are updated to a new value that was determined in the operation block 226. Otherwise, at operation block 234, the control is transferred to the operation block 220.

Figure 3:
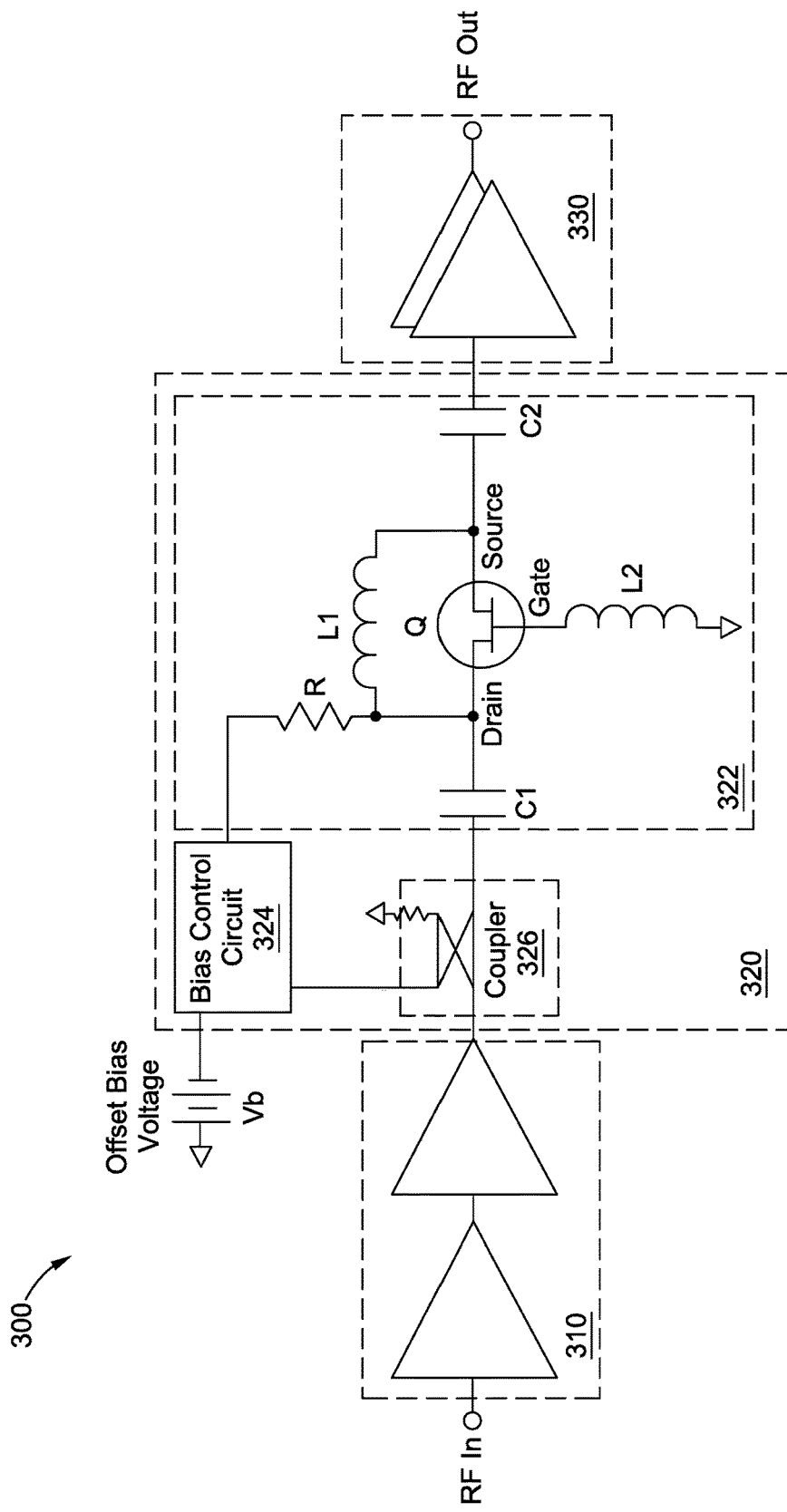
FIG. 3 is a diagram illustrating an example of an adaptive linearizer, according to certain aspects.

FIG. 3 is a diagram illustrating an example of an adaptive linearizer 320, according to certain aspects of the subject technology. The adaptive linearizer 320 is a part of a transmit path 300 which includes a radio-frequency (RF) driver amplifier stage(s) 310, the adaptive linearizer 320, and an RF power amplifier stage(s) 330. The description of the RF driver amplifier stage(s) 310 and RF power amplifier stage(s) 330 are known and are skipped here for brevity. The adaptive linearizer block 320 includes a coupler 326, a bias control circuit 324, and a linearizer circuit 322. The bias control circuit 324 is coupled to an input line of the linearizer circuit 322 via a coupler 326 that is a known element. In some implementations, the bias control circuit 324 performs the functionalities of and includes the satellite-based control unit 210, sensors A through C, and the temperature sensor 206 of FIG. 2A.

The linearizer circuit 322 includes coupling capacitors C1 and C2 and the linearizer circuit 322 including a transistor (e.g., a field effect transistor (FET)) Q, a resistor R, and inductors L1 and L2. The transistor Q is biased in such a way that the drain-to-source path is a series connection, from an input 315 to an output 325 of the linearizer circuit 322. As the gate-to-source bias potential of the transistor Q is adjusted, the impedance of the drain-to-source connection varies according to the transconductance of the transistor Q. The bias voltage Vb is applied in such a way that the voltage drop from drain-to-source of the transistor Q remains at 0V, while the voltage drop from gate-to-source of the transistor Q becomes more negative with increased bias voltage Vb. With this configuration, as the RF input signal increases, the insertion loss of the linearizer circuit 322 decreases. The value of components (e.g., R, L1, and L2) in the linearizer circuit 322 and the bias voltage Vb are optimized in order to make the AM-AM and AM-PM responses of the linearizer circuit 322 counter the respective AM-AM and AM-PM responses of the RF power amplifier stage(s) 330. The linearizer circuit 322, however, can be optimized only for a very narrow window of RF power if used without the adaptive features. The subject technology addresses this shortcoming by using the bias control circuit 324 to dynamically adjust the bias settings of the linearizer circuit 322 as described above, with respect to FIGS. 2A and 2B.

In one or more implementations, instead of using a single linearizer circuit 322, multiple linearizer circuit (e.g., similar to 322) can be combined to form an adaptive multi-stage linearizer. The multi-stage linearizer is fully described in a related patent application (U.S. patent application Ser. No. 14/832,982, filed Aug. 21, 2015) by the applicants of the current application, which is incorporated by reference in its entirety herein.

Figure 4:
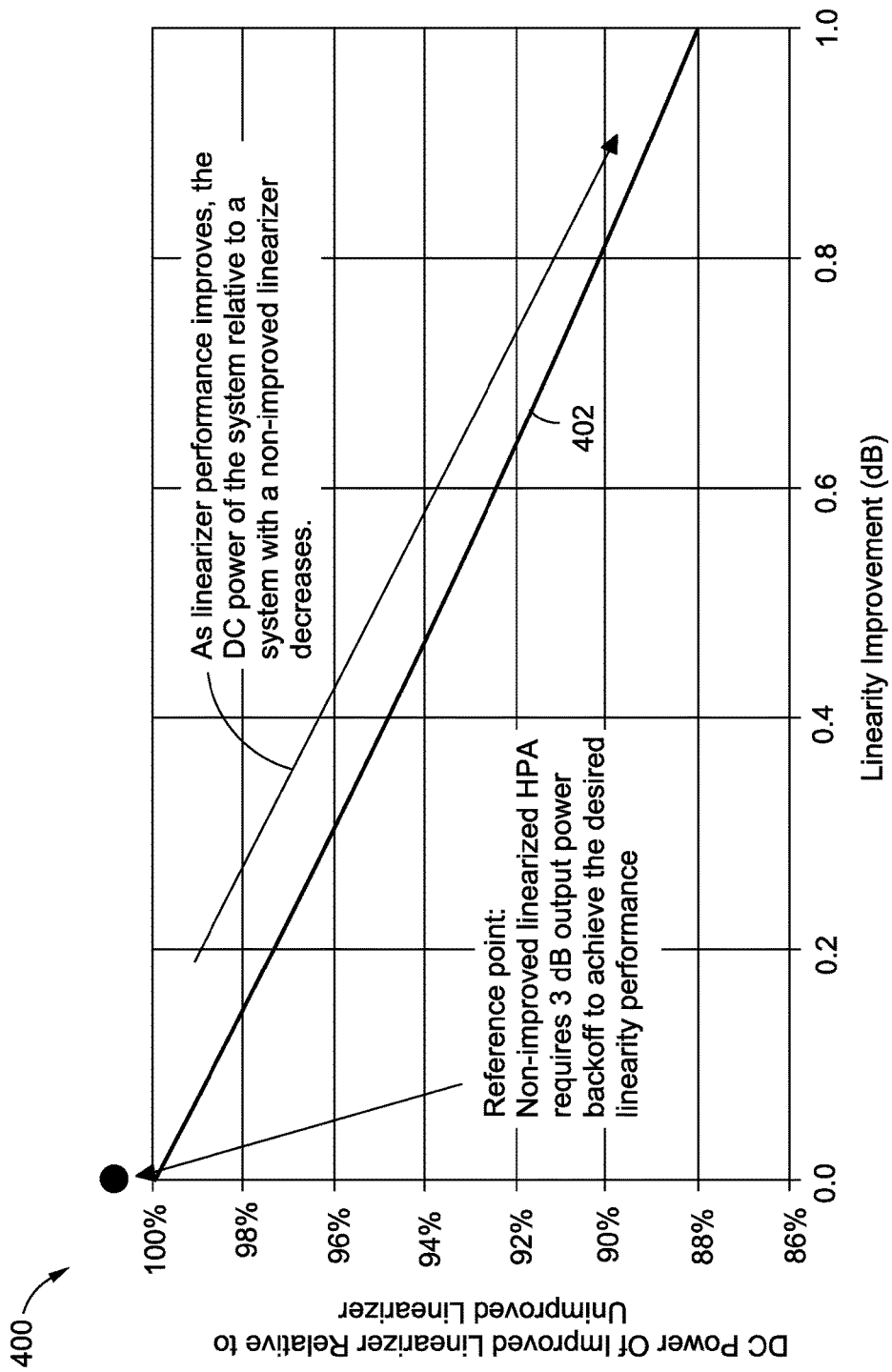
FIG. 4 is a diagram illustrating an example plot showing DC power saving of a high-power amplifier with improved linearization, according to certain aspects.

FIG. 4 is a diagram illustrating an example plot 400 showing DC power saving of a high-power amplifier with improved linearization, according to certain aspects. The plot 400 shows DC power level of a high-power amplifier versus linearity improvement (dB). The DC power level shown in percentile is relative to a DC high-power amplifier linearized with an unimproved linearizer that requires 3 dB output back-off. The relative DC power of the power amplifier is seen to decrease as the linearizer performance improves (e.g., by using an adaptive linearizer). For a typical satellite that may operate 68 power amplifiers (e.g., TWTAs) at 3 dB or more output back-off with a payload DC power of 14000 W, a 0.4 dB increase in linearity, which allows 0.4 dB less output power back-off, could result in a 5% reduction in payload power, or 280 W. This reduction in DC power provides a corresponding decrease in the cost of the various subsystems that support the payload, including the electrical power subsystem (batteries, solar array). Other advantageous features of the subject technology are described below.

Figure 5:
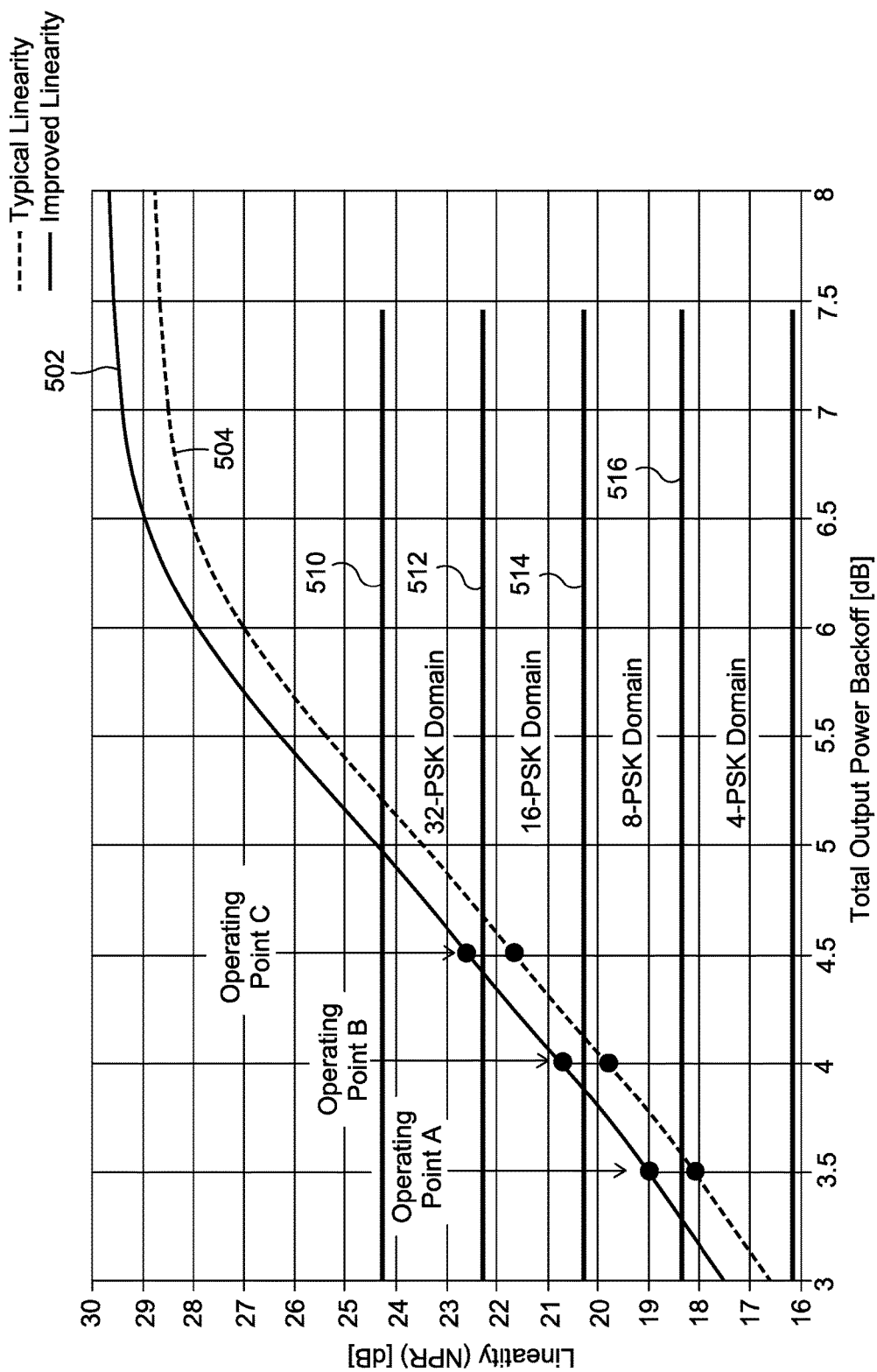
FIG. 5 is a diagram illustrating example plots showing ability to use higher order modulation with improved linearization of a power amplifier, according to certain aspects.

FIG. 5 is a diagram illustrating example plots 502 and 504 showing ability to use higher order modulation with improved linearization of a power amplifier, according to certain aspects. The plots 502 and 504 show the linearity (characterized by NPR (in dB)) versus total power back-off for a power amplifier with an improved linearizer (e.g., adaptive linearizer) and a power amplifier with a typical linearizer, respectively. The horizontal lines 510, 512, 514, and 516 divide the plane of the plot into a number of domains such as 32-PSK, 16-PSK, 8PSK, and 4-PSK modulation domains. For example, the 16-PSK domain shows a region of the plot where a linearized power amplifier operating in that region can be used in an RF transmitter applying the 16-PSK modulation scheme. In other words, the higher order modulation schemes are more demanding on the linearity of the power amplifier. The operating points A, B, and C correspond to three levels of total power back-off (e.g., ~3.5 dB, ~4 dB, and ~4.5 dB). For the three operating points, the power amplifier with an improved linearizer (e.g., of plot 502) are capable of supporting a higher order modulation scheme. For instance, at operating point B, the power amplifier with the typical linearity (plot 504) can only support 8-PSK modulation scheme, whereas the power amplifier with the improved linearity (plot 502) can support 16-PSK modulation scheme, which provides higher fidelity.

The results shown by the plots 502 and 504 further indicate that at some particular back-off point, an improved linearizer may provide better linearity for a specific type of signal being carried through the linearizer. This improved linearity may be a key enabler for allowing signals that are highly susceptible to linearity degradations (such as higher-order modulations types, such as 32-PSK) to operate with adequate link margin in a reasonably-sized satellite system. The higher order modulation enabled by the linearity-improved system allows more information throughput through the system compared to an un-improved system at the same amplifier back-off point because the spectral efficiency (bps/symbol or bps/Hz) is increased. In this case, the DC power resources used for the system may be approximately the same as the system with the un-improved linearizer, but more throughput is achieved, increasing the bits-per-second/Hz/$, a key benchmark for high-throughput satellite systems. The higher-order modulations would have higher spectral efficiency and therefore higher throughput or capacity, which translates into higher revenue for the operator. For example, the spectral efficiency could increase from QPSK-3/4r coding with a spectral efficiency of 1.45 bps/symbol to 8-PSK-3/4r coding with a spectral efficiency of 2.18 bps/symbol, for a ~50% increase in capacity.

Figure 6:
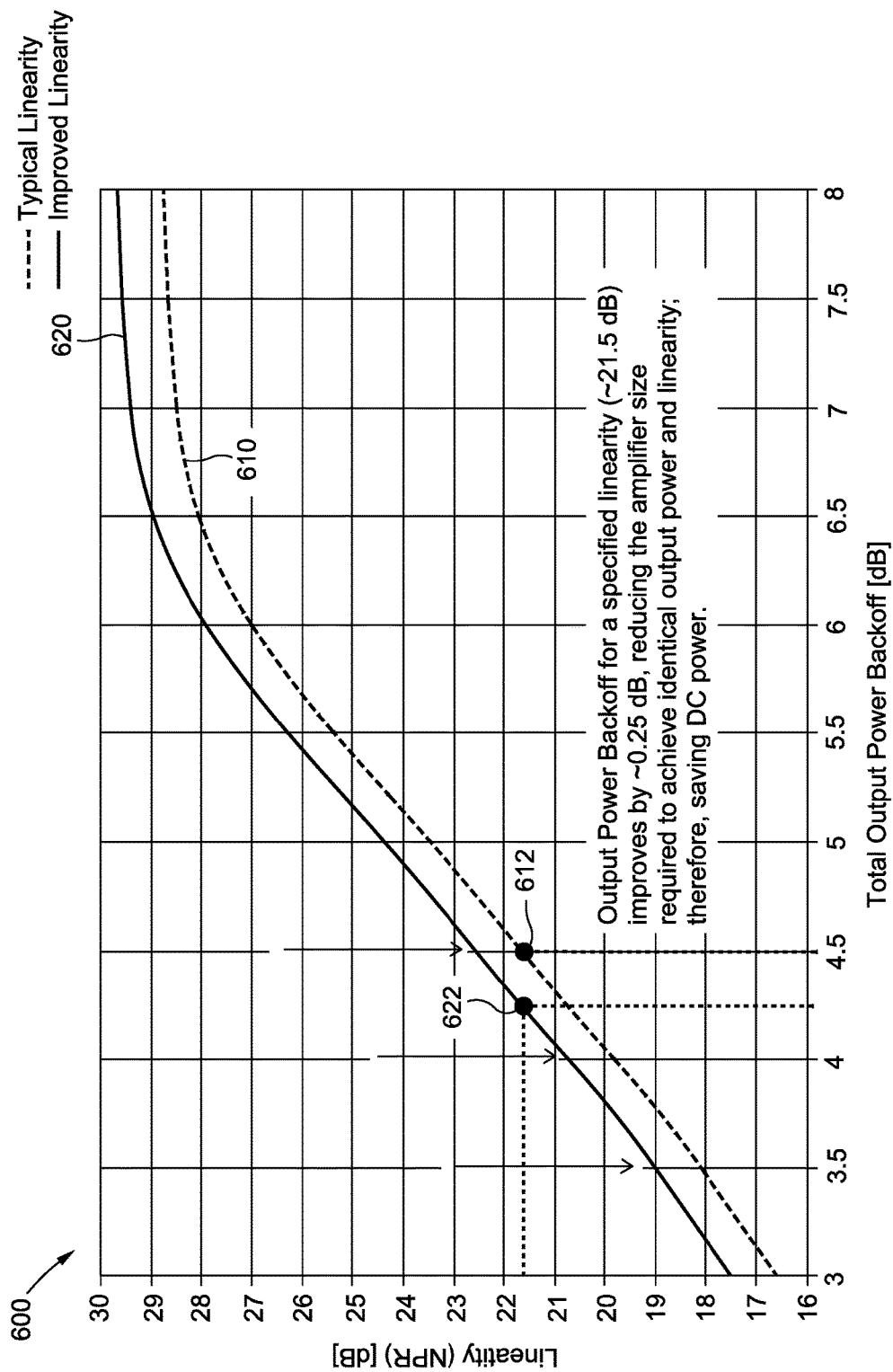
FIG. 6 is a diagram illustrating example plots showing ability to use less DC power with improved linearization of a power amplifier, according to certain aspects.

FIG. 6 is a diagram illustrating example plots 602 and 604 showing ability to use less DC power with improved linearization of a power amplifier, according to certain aspects. The plots 602 and 604 are similar to the plots 502 and 504 of FIG. 5, except that they are used to indicate power back-off reduction as a result of linearity improvement. For example, at a specific level of linearity (e.g., ~21.5 dB) a typical linearity PA operates at point 612 on the plot 610, which corresponds to ~4.5 dB power back-off, whereas at the same level of linearity, a linearity-improved PA operates at a point 622 on the plot 620, which corresponds to ~0.25 dB lower (e.g., at 4.25 dB) power back-off. In other words, a better linearity may be achieved at a specific operating point, but, if the system does not require improved linearity for the signal traffic type it is carrying, the improvement could be used to reduce the required DC power for the amplifier and the system as a whole.

Figure 7:
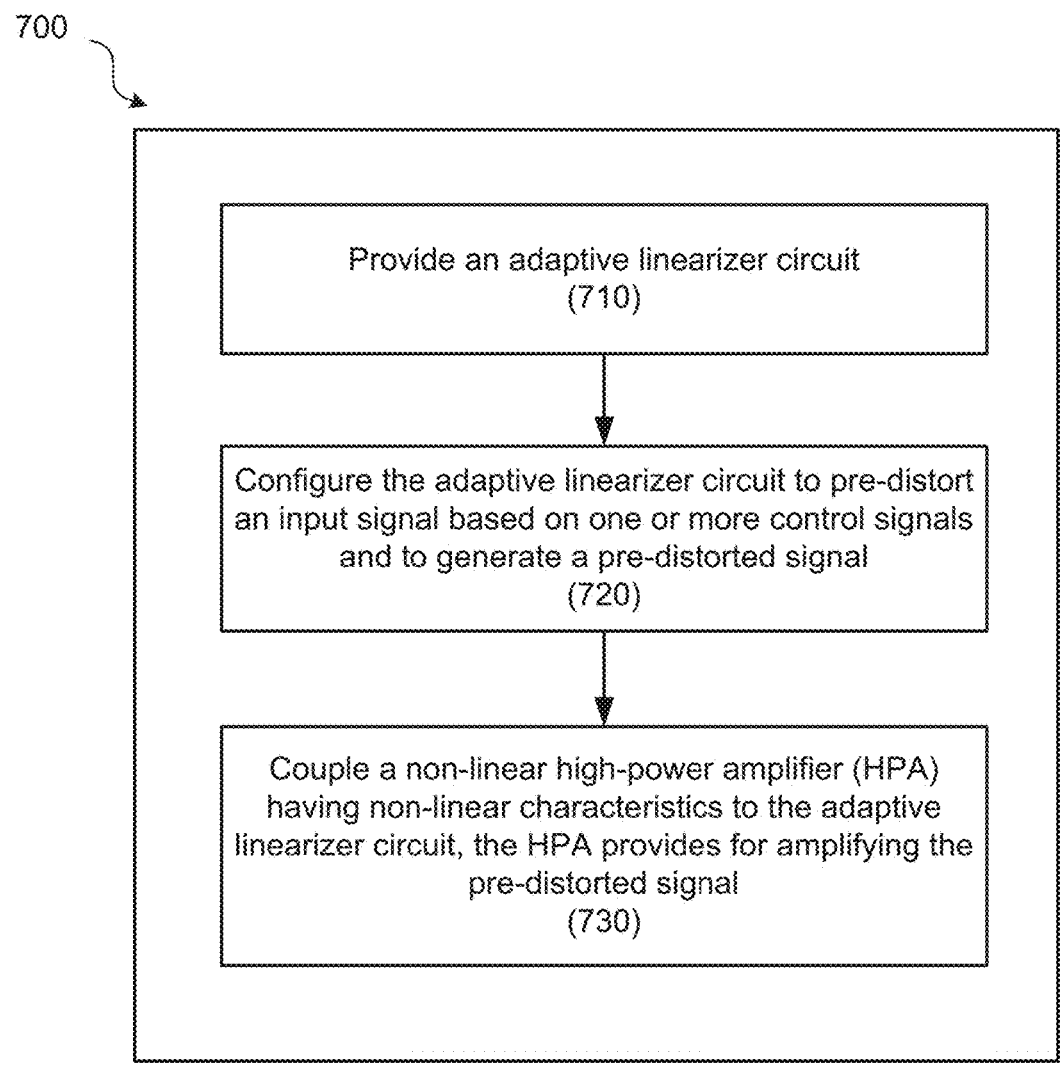
FIG. 7 is a flow diagram illustrating an example of a method for compensating non-linearity of a non-linear high-power amplifier, according to certain aspects.

FIG. 7 is a flow diagram illustrating an example of a method 700 for compensating non-linearity of a non-linear high-power amplifier, according to certain aspects of the subject technology. The method 700 includes providing an adaptive linearizer circuit (e.g., 320 of FIGS. 3 and 210, 212, sensors A through D, and 206 of FIG. 2A) (710), and configuring the adaptive linearizer circuit to pre-distort (e.g., as in 130 and 136 of FIG. 1C) an input signal based on one or more control signals (e.g., 322 of FIG. 2B) and to generate a pre-distorted signal (720). A non-linear high-power amplifier (HPA) (e.g., 204 of FIG. 2A or 330 of FIG. 3) having non-linear characteristics (e.g., as in 132 and 138 of FIG. 1C) is coupled to the adaptive linearizer circuit (730). The HPA provides for amplifying the pre-distorted signal. Pre-distortion characteristics of the adaptive linearizer circuit provide for countering the non-linear characteristics of the non-linear HPA and compensating a non-linearity of the non-linear HPA (e.g., as in 134 and 140 of FIG. 1C).

Figure 8:
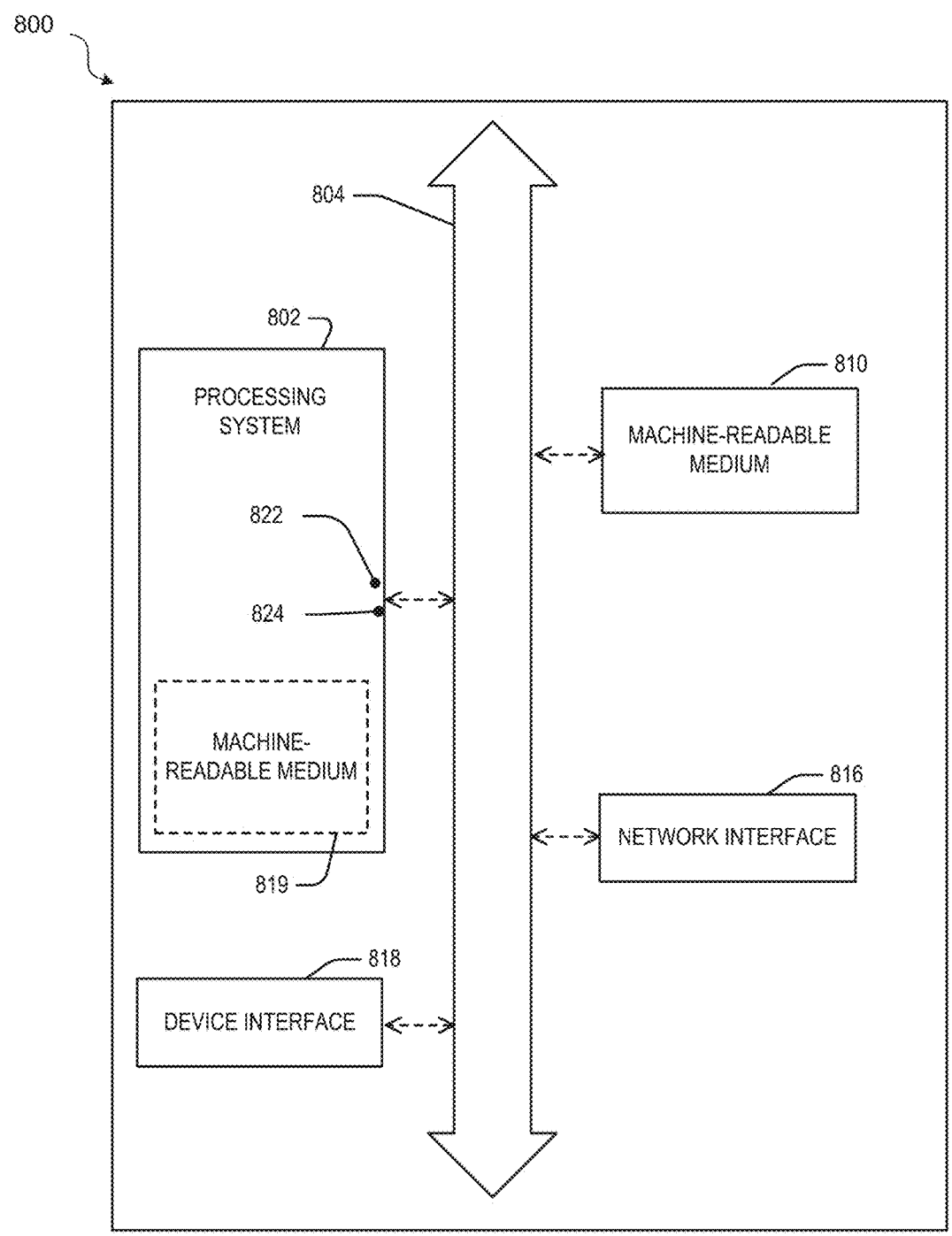
FIG. 8 is a diagram illustrating an example of a system for implementing some aspects.

FIG. 8 is a diagram illustrating an example of a system 800 for implementing some aspects of the subject technology. The system 800, for example, may be a computer system that is used by the the adaptive linearizer of the subject technology, for example, to store computed tables described with respect to FIG. 2B and/or to perform sensor data processing (e.g., 222 of FIG. 2B) or other processing related to the described adaptive linearizer of the subject technology. The system 800 includes a processing system 802, which may include one or more processors or one or more processing systems. A processor can be one or more processors. The processing system 802 may include a general-purpose processor or a specific-purpose processor for executing instructions and may further include a machine-readable medium 819, such as a volatile or non-volatile memory, for storing data and/or instructions for software programs. The instructions, which may be stored in a machine-readable medium 810 and/or 819, may be executed by the processing system 802 to control and manage access to the various networks, as well as provide other communication and processing functions. The instructions may also include instructions executed by the processing system 802 for various user interface devices, such as a display 812 and a keypad 814. The processing system 802 may include an input port 822 and an output port 824. Each of the input port 822 and the output port 824 may include one or more ports. The input port 822 and the output port 824 may be the same port (e.g., a bi-directional port) or may be different ports.

The processing system 802 may be implemented using software, hardware, or a combination of both. By way of example, the processing system 802 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 819) may include storage integrated into a processing system such as might be the case with an ASIC. Machine-readable media (e.g., 810) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art recognizes how best to implement the described functionality for the processing system 802. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 802 or one or more processors. Instructions can be, for example, a computer program including code for performing methods of the subject technology.

A network interface 816 may be any type of interface to a network (e.g., an Internet network interface), and may reside between any of the components shown in FIG. 8 and coupled to the processor via the bus 804.

A device interface 818 may be any type of interface to a device and may reside between any of the components shown in FIG. 8. A device interface 818 may, for example, be an interface to an external device that plugs into a port (e.g., USB port) of the system 800.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An adaptive linearizer system, the system comprising:
   an adaptive linearizer circuit configured to pre-distort an input signal based on one or more control signals to generate a pre-distorted signal; and
   a non-linear high-power amplifier (HPA) having non-linear characteristics coupled to the adaptive linearizer circuit to amplify the pre-distorted signal,
   wherein the adaptive linearizer circuit comprises an adaptive bias-control circuit configured to control a bias point of a pre-distortion circuit to adjust pre-distortion characteristics of the adaptive linearizer circuit based on the one or more control signals including sensor data aggregated using an adaption algorithm based on sensor characteristics related tables, and wherein the pre-distortion characteristics of the adaptive linearizer circuit provide for countering the non-linear characteristics of the non-linear HPA and compensating a non-linearity of the non-linear HPA.

2. The system of claim 1, wherein the non-linear characteristics comprise nonlinear amplitude and phase characteristics, wherein the pre-distortion characteristics comprise pre-distortion amplitude and phase characteristics, and wherein the adaptive linearizer circuit is configured to provide dynamically adaptable pre-distortion characteristics by operating in at least one of autonomous or operator-in-loop modes of operation.

3. The system of claim 2, wherein the HPA is associated with a communication system of a satellite, and wherein in the operator-in-loop mode of operation, at least some of the one or more control signals are provided based on at least some of operator commands or signals from one or more first sensors.

4. The system of claim 3, wherein the one or more first sensors comprise at least one of a peak-power sensor, a peak voltage sensor, an average power sensor, an average voltage sensor, or a frequency sensor.

5. The system of claim 1, wherein in an autonomous mode of operation, the one or more control signals are generated based on signals from one or more sensors.

6. The system of claim 5, wherein the one or more sensors are configured to detect an operating condition of at least one of the system or the HPA, and the one or more sensors comprise at least some of a peak-power sensor, a peak voltage sensor, an average power sensor, an average voltage sensor, a frequency sensor, or a temperature sensor.

7. The system of claim 1, wherein the adaptive linearizer circuit comprises the pre-distortion circuit, wherein the adaptive bias-control circuit is further configured to control a value of a bias voltage of the pre-distortion circuit to adjust the pre-distortion characteristics of the adaptive linearizer circuit.

8. The system of claim 1, wherein the adaptive linearizer circuit is configured to improve linearity of the HPA for operation with signals having high-order modulation, wherein the high-order modulation comprise high-order asymmetric phase shift keying (APSK) modulations including, 32APSK, 64APSK, 128APSK, and 256APSK.

9. A method of compensating non-linearity of a non-linear high-power amplifier (HPA), the method comprising:
   providing an adaptive linearizer circuit;
   configuring the adaptive linearizer circuit to pre-distort an input signal based on one or more control signals and to generate a pre-distorted signal; and
   coupling the HPA having non-linear characteristics to the adaptive linearizer circuit to amplify the pre-distorted signal,
   wherein providing the adaptive linearizer circuit comprises providing an adaptive bias-control circuit configured to control a bias point of a pre-distortion circuit to adjust pre-distortion characteristics of the adaptive linearizer circuit based the on one or more control signals including sensor data aggregated using an adaption algorithm based on sensor characteristics related tables, and wherein the pre-distortion characteristics of the adaptive linearizer circuit provide for countering the non-linear characteristics of the non-linear HPA and compensating a non-linearity of the non-linear HPA.

10. The method of claim 9, wherein the non-linear characteristics comprise nonlinear amplitude and phase characteristics, wherein the pre-distortion characteristics comprise pre-distortion amplitude and phase characteristics, and the method further comprises configuring the adaptive linearizer circuit to operate in at least one of autonomous or operator-in-loop modes of operation to provide dynamically adaptable pre-distortion characteristics.

11. The method of claim 10, wherein the HPA is associated with a communication system of a satellite, and wherein the method further comprises configuring, in the operator-in-loop mode of operation, a ground-based control unit to provide at least some of the one or more control signals based on at least some of operator commands or signals from one or more first sensors.

12. The method of claim 11, wherein the one or more first sensors comprise at least one of a peak-power sensor, a peak voltage sensor, an average power sensor, an average voltage sensor, or a frequency sensor.

13. The method of claim 9, the method further comprises configuring, in an autonomous mode of operation, a satellite-based control unit to generate the one or more control signals based on signals from one or more sensors and by using the adaptation algorithm.

14. The method of claim 13, further comprises configuring the one or more sensors to detect an operating condition of at least the HPA, and wherein the one or more sensors comprise at least some of a peak-power sensor, a peak voltage sensor, an average power sensor, an average voltage sensor, a frequency sensor, or a temperature sensor.

15. The method of claim 9, wherein providing the adaptive linearizer circuit comprises providing the pre-distortion circuit, and wherein the method comprises configuring the adaptive bias-control circuit to control a value of a bias voltage of the pre-distortion circuit to adjust the pre-distortion characteristics of the adaptive linearizer circuit.

16. The method of claim 9, further comprising configuring the adaptive linearizer circuit to improve linearity of the HPA for operation with signals having high-order modulation, wherein the high-order modulation comprise high-order asymmetric phase shift keying (APSK) modulations including, 32APSK, 64APSK, 128APSK, and 256APSK.

17. A satellite communication system comprising:
a satellite transmit antenna configured to transmit signals to a ground receiver antenna;
an adaptive linearizer circuit configured to dynamically pre-distort an input signal based on one or more control signals to generate a pre-distorted signal; and
a non-linear high-power amplifier (HPA) having non-linear characteristics coupled to the adaptive linearizer circuit to amplify the pre-distorted signal,
wherein the adaptive linearizer circuit comprises an adaptive bias-control circuit configured to control a bias point of a pre-distortion circuit to adjust pre-distortion characteristics of the adaptive linearizer circuit based on the one or more control signals including sensor data aggregated using an adaption algorithm based on sensor characteristics related tables, and wherein the pre-distortion characteristics of the adaptive linearizer circuit provide for countering the non-linear characteristics of the non-linear HPA and compensating a non-linearity of the non-linear HPA.

18. The satellite system of claim 17, wherein the non-linear characteristics comprises nonlinear amplitude and phase characteristics.

19. The satellite system of claim 17, wherein the pre-distortion characteristics comprises pre-distortion amplitude and phase characteristics.

20. The satellite system of claim 17, wherein the adaptive linearizer circuit is configured to operate in at least one of autonomous or operator-in-loop modes of operation to provide dynamically adaptable pre-distortion characteristics.

* * * * *